United States Patent
Hoeglauer et al.

(10) Patent No.: US 8,987,880 B2
(45) Date of Patent: Mar. 24, 2015

(54) CHIP MODULE AND A METHOD FOR MANUFACTURING A CHIP MODULE

(75) Inventors: Josef Hoeglauer, Heimstetten (DE); Ralf Otremba, Kaufbeuren (DE); Xaver Schloegel, Sachsenkam (DE)

(73) Assignee: Infineon Technologies AG, Neubiberg (DE)

( * ) Notice: Subject to any disclaimer, the term of this patent is extended or adjusted under 35 U.S.C. 154(b) by 112 days.

(21) Appl. No.: 13/611,007

(22) Filed: Sep. 12, 2012

(65) Prior Publication Data

US 2013/0062722 A1    Mar. 14, 2013

(30) Foreign Application Priority Data

Sep. 13, 2011  (DE) .................. 10 2011 113 255

(51) Int. Cl.
| | |
|---|---|
| H01L 23/495 | (2006.01) |
| H01L 23/34 | (2006.01) |
| H01L 37/00 | (2006.01) |
| H01L 23/00 | (2006.01) |

(52) U.S. Cl.
CPC ........ *H01L 23/49575* (2013.01); *H01L 23/495* (2013.01); *H01L 23/4951* (2013.01); *H01L 23/49513* (2013.01); *H01L 23/49562* (2013.01); *H01L 37/00* (2013.01); *H01L 24/32* (2013.01); *H01L 2224/32245* (2013.01); *H01L 2924/13091* (2013.01); *H01L 2924/13055* (2013.01)

USPC .... 257/676; 257/727; 257/502; 257/E23.039; 257/E23.04

(58) Field of Classification Search
CPC ....... H01L 23/495; H01L 21/60; H01L 37/00; H01L 23/49575; H01L 23/4951; H01L 23/49513
USPC ......................................... 257/676, 727, 502
See application file for complete search history.

(56) References Cited

U.S. PATENT DOCUMENTS

| | | | | |
|---|---|---|---|---|
| 5,637,828 | A * | 6/1997 | Russell et al. | 174/537 |
| 6,385,049 | B1 * | 5/2002 | Chia-Yu et al. | 361/721 |
| 6,744,121 | B2 * | 6/2004 | Chang et al. | 257/668 |
| 6,885,092 | B1 * | 4/2005 | Sakuma et al. | 257/686 |
| 2005/0253230 | A1 | 11/2005 | Punzalan et al. | |
| 2006/0255458 | A1 * | 11/2006 | Dangelmaier | 257/735 |
| 2009/0001535 | A1 | 1/2009 | Heng et al. | |
| 2009/0051019 | A1 * | 2/2009 | Huang et al. | 257/676 |

FOREIGN PATENT DOCUMENTS

DE    112005003614 T5    7/2008

* cited by examiner

*Primary Examiner* — Luan C Thai

(57) ABSTRACT

In various embodiments, a chip module may include a first chip; and a leadframe with a first leadframe area and a second leadframe area, wherein the first leadframe area is electrically insulated from the second leadframe area; wherein the first chip is arranged at least partially on the first leadframe area and at least partially on the second leadframe area.

12 Claims, 2 Drawing Sheets

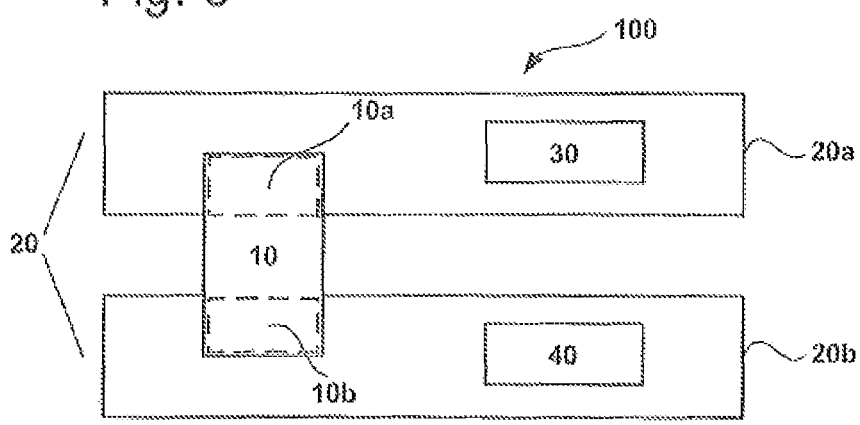
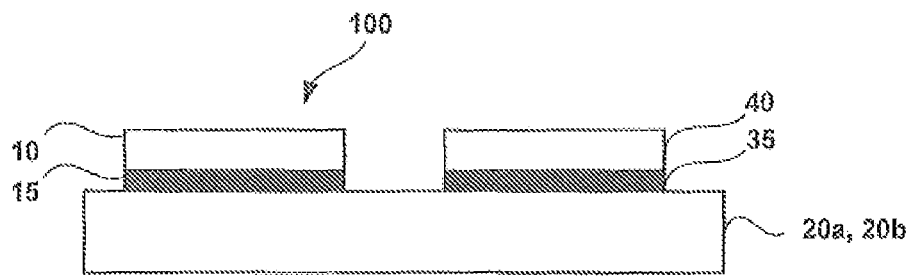

CHIP MODULE AND A METHOD FOR MANUFACTURING A CHIP MODULE

CROSS-REFERENCE TO RELATED APPLICATION

This application claims priority to German Patent Application Serial No. 10 2011 113 255.8, which was filed Sep. 13, 2011, and is incorporated herein by reference in its entirety.

BACKGROUND

Various embodiments relate to a chip module and to a method for manufacturing a chip module.

Chip modules may include one or more power semiconductor chips and one or more chips which are operated in the standard power range. In such chip modules, the power semiconductor chip is often arranged insulated from the chip which is operated in the standard power range.

If a plurality of semiconductor chips are to be arranged insulated from one another in a module, they are often arranged in such a way that they are located one next to the other, in areas which are mechanically and electrically isolated/insulated from one another, for example two leadframe areas which are isolated/insulated from one another. These areas which are mechanically and electrically isolated/insulated from one another are also referred to as chip islands.

DE 11 2005 003 614 T5 discloses a semiconductor assembly for a switch-mode power supply. The semiconductor assembly includes a chip field with at least two areas which are mechanically isolated and electrically insulated from one another by a plastic housing material. The control semiconductor chip is mounted here on a first area, and the semiconductor power switch or the switches is/are mounted on a second, mechanically and electrically insulated area.

Because of new applications, which are becoming more and more complex, but also for reasons of cost, there is a demand for the integration density of the chips in such modules to be increased continuously, and at the same time for technical reasons relating to mounting the outer dimensions and the contact pad arrangements are to be retained as far as possible.

SUMMARY

In various embodiments, a chip module may include a first chip; and a leadframe with a first leadframe area and a second leadframe area, wherein the first leadframe area is electrically insulated from the second leadframe area; wherein the first chip is arranged at least partially on the first leadframe area and at least partially on the second leadframe area.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3 shows a second exemplary embodiment of a chip module 100 in a plan view; and FIG. 4 shows the second exemplary embodiment of the chip module 100 in a side view.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments make available a chip module with an improved integration density while having the same outer dimensions.

Figure 1:
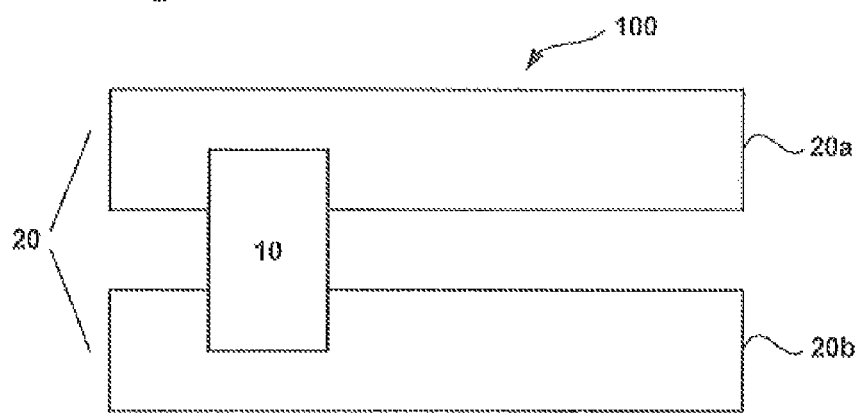
FIG. 1 a first exemplary embodiment of a chip module 100 in a plan view.

FIG. 1 illustrates an embodiment of a chip module 100 in a plan view. The chip module 100 has a first chip 10 and a leadframe 20 with a first leadframe area 20a and with a second leadframe area 20b. The first leadframe area 20a and the second leadframe area 20b are electrically insulated from one another. The first chip 10 is at least partially arranged on the first leadframe area 20a and at least partially on the second leadframe area 20b.

The first chip 10 spans the free area between the first leadframe area 20a and the second leadframe area 20b and therefore increases the integration density in the chip module 100.

Figure 2:
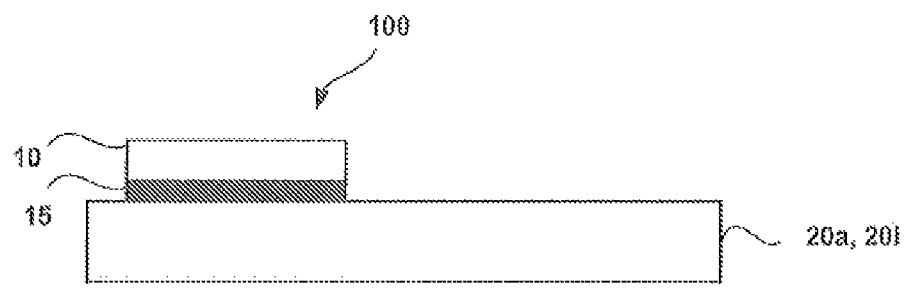
FIG. 2 shows a first exemplary embodiment of the chip module 100 in a side view.

As is illustrated in the side view of the first exemplary embodiment in FIG. 2, an insulating adhesive 15 can be arranged between the first chip 10 and one leadframe area or both of the leadframe areas 20a, 20b. The insulating adhesive 15 prevents, on the one hand, a short-circuit between the two leadframe areas 20a and 20b and, on the other hand, ensures secure fixing of the first chip 10 on the first leadframe area 20a and/or on the second leadframe area 20b. An insulating adhesive film can also be used as an insulating adhesive 15.

FIG. 3 illustrates an embodiment of a chip module 100 in a plan view. In this embodiment, in addition to the embodiment shown in FIG. 1, a second chip 30 is arranged on the first leadframe area 20a, and a third chip 40 is arranged on the second leadframe area 20b. The first chip 10, the second chip 30 and the third chip 40 may be electrically connected to one another by means of bonding wires.

The first chip may be a gate driver integrated circuit (IC), a microcontroller IC and/or some other chip which is configured for controlling power semiconductor chips. The second chip 30 and/or the third chip 40 may be power semiconductor chips such as, for example, metal oxide semiconductor field effect transistors (MOSFETs) or power metal oxide semiconductor field effect transistors (power MOSFETs).

FIG. 3 additionally illustrates a first area 10a and a second area 10b of the first chip 10. The first area 10a is the overlapping area between the first chip 10 and the first leadframe area 20a. The second area 10b is the overlapping area between the first chip 10 and the second leadframe area 20b.

As is illustrated in a side view of the second exemplary embodiment in FIG. 4, an insulating adhesive 15 may be arranged between the first area 10a of the first chip 10 and the first leadframe area 20a as well as between the second area 10b of the first chip 10 and the second leadframe area 20b.

The second chip 30 and the third chip 40 may be attached by means of an electrically conductive adhesive 35, wherein the electrically conductive adhesive 35 is arranged between the second chip 30 and the first leadframe area 20a, and the third chip 40 and the second leadframe area 20b.

The adhesive 35 may be based here on polyimide or epoxide and may contain particles made of silver, copper, gold and/or some other conductive material.

The chip module according to various embodiments may include a first chip, a leadframe with a first leadframe area and a second leadframe area, wherein the first leadframe area is electrically insulated from the second leadframe area, wherein the first chip is arranged at least partially on the first leadframe area and at least partially on the second leadframe area.

As a result of the spanning and therefore use of the area between the leadframe areas for the arrangement of a chip, the integration density is increased without the outer dimensions of the chip module changing. As a result, existing contact pad arrangements and existing mounting concepts can be retained.

In order to avoid a short circuit between the two leadframe areas, it may be provided to insulate the first chip from one leadframe area or from both leadframe areas. For this purpose, and for the purpose of attaching the first chip, an electrically insulating adhesive may be arranged between the first chip and the first leadframe area and, if appropriate, between the first chip and the second leadframe area.

The insulating adhesive may be based in this context on polyimide or epoxide and may include particles made of aluminum oxide and/or of some other metal oxide, particles made of silicon oxide and/or some other semiconductor oxide and/or particles made of a metal nitride and/or from a semiconductor nitride. An insulating adhesive film may also be used as an insulating adhesive.

The chip module may also have a second chip and a third chip, wherein the second chip may be arranged on the first leadframe area, and the third chip may be arranged on the second leadframe area. The second and the third chips can be connected directly to the associated leadframe area by means of flip-chip technology. For this purpose, for example an electrically conductive adhesive is applied between the chip and the leadframe area. The electrically conductive adhesive may be based, for example, on polyimide or epoxide and may include particles made of silver, copper, gold and/or of some other conductive material.

The second chip and/or the third chip may be a power semiconductor chip, for example a MOSFET (Metal Oxide Semiconductor Field Effect Transistor), a power MOSFET, a JFET (Junction Field Effect Transistor), an IGBT (Insulated Gate Bipolar Transistor), a BJT (Bipolar Junction Transistor), a thyristor, a PN diode and/or a Schottky diode.

The first chip may be electrically connected to the second chip and/or to the third chip. The first chip may be a gate driver IC, a microcontroller IC and/or some other chip which is configured for controlling the above-mentioned power semiconductor chip or chips. Such control chips are operated under relatively low power conditions and are also referred to as non-power or minimum-power semiconductor chips.

In a further embodiment, the first chip is configured to measure and to monitor electrical conditions and/or ambient conditions (for example temperature, magnetic flux etc.) within the chip module. For this purpose, the first chip may, for example, have a first temperature sensor for measuring the temperature of the first leadframe area, and a second temperature sensor for measuring the temperature of the second leadframe area. In this embodiment, the first chip may also be configured to control the second chip or the third chip.

The first chip may have here logic circuits and/or a software-based data processing device and include part of the control circuit or driver circuit, or the entirety thereof.

The chip module may be embedded at least partially in a sealing compound. The sealing compound can be manufactured, for example, from a thermoplast or from a Duroplast, for example, an epoxy resin.

Embodiments of the chip module may constitute various circuits, for example a voltage power controller, a power controller circuit, a DC/DC step-up converter or step-down converter, a AC/DC step-up or step-down converter or some other power circuit.

The method according to the invention for manufacturing a chip module, having a first chip and a leadframe with a first leadframe area and a second leadframe area, wherein the first leadframe area is electrically insulated from the second leadframe area. The method may include arranging a first area of the first chip on a section of the first leadframe area, and arranging a second area of the first chip on a section of the second leadframe area.

Furthermore, an electrically insulating adhesive may be applied between the first area of the first chip and the first leadframe area and/or between the second area of the first chip and the second leadframe area.

Furthermore, a second chip can be arranged on the first leadframe area, and a third chip may be arranged on the second leadframe area. The two chips may be connected to the respective leadframe area with, for example, a solder or with an electrically conductive adhesive material.

Moreover, the first chip may be connected to the second chip and/or to the third chip by means of a bonding wire.

In order to provide better protection against external influences and for the purpose of better mounting, the chip module may be at least partially embedded in a sealing compound.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip module, comprising:
   a first chip; and
   a leadframe with a first leadframe area and a second leadframe area, wherein the first leadframe area is electrically insulated from the second leadframe area, wherein the first chip is arranged at least partially on a section of the first leadframe area and at least partially on a section of the second leadframe area so as to span a free area between the first lead frame area and the second leadframe area;
   a second chip arranged on the first leadframe area;
   a third chip arranged on the second leadframe area;
   an electrically insulating adhesive arranged at least one of between the first chip and the first leadframe area at the first leadframe area section or between the first chip and the second leadframe area at the second leadframe area section, so as to electrically insulate the first chip from at least one of the first leadframe area or the second leadframe area.

2. The chip module as claimed in claim 1, wherein the electrically insulating adhesive is based on one of polyimide and epoxide.

3. The chip module as claimed in claim 2, wherein the electrically insulating adhesive comprises particles made of at least one of aluminum oxide and of some other metal oxide, particles made of at least one of silicon oxide and some other semiconductor oxide and particles made of a metal nitride and from a semiconductor nitride.

4. The chip module as claimed in claim 1, wherein the electrically insulating adhesive is an adhesive film.

5. The chip module as claimed in claim 1, further comprising:
an electrically conductive adhesive;
wherein the electrically conductive adhesive is arranged between the second chip and the first leadframe area, and the third chip and the second leadframe area.

6. The chip module as claimed in claim 5, wherein the electrically conductive adhesive is based on one of polyimide and epoxide; and wherein the electrically conductive adhesive comprises particles made of one of a group consisting of: silver; copper; gold; and some other conductive material.

7. The chip module as claimed in claim 1, wherein at least one of the second chip and the third chip is a metal oxide semiconductor field effect transistor.

8. The chip module as claimed in claim 7, wherein at least one of the second chip and the third chip is a power metal oxide semiconductor field effect transistor.

9. The chip module as claimed in claim 1, wherein the first chip is at least one of a gate driver integrated circuit and a microcontroller integrated circuit.

10. The chip module as claimed claim 1, wherein the first chip is electrically connected to at least one of the second chip and to the third chip.

11. The chip module as claimed in claim 1, wherein the first chip has a first temperature sensor for measuring the temperature of the first leadframe area and a second temperature sensor for measuring the temperature of the second leadframe area.

12. The chip module as claimed in claim 1, wherein the chip module is embedded at least partially in a sealing compound.

* * * * *